United States Patent [19]
Reele et al.

[11] Patent Number: 5,213,676
[45] Date of Patent: May 25, 1993

[54] METHOD OF GENERATING A SUBSTRATE ELECTRODE FOR FLIP CHIP AND OTHER APPLICATIONS

[75] Inventors: Samuel Reele; Thomas R. Pian, both of Rochester, N.Y.

[73] Assignee: Eastman Kodak Company, Rochester, N.Y.

[21] Appl. No.: 883,603

[22] Filed: May 11, 1992

[51] Int. Cl.$^5$ .............................................. C25D 5/02
[52] U.S. Cl. ..................................... 205/118; 205/122
[58] Field of Search ................................. 205/118, 122

[56] References Cited

U.S. PATENT DOCUMENTS

| | | | |
|---|---|---|---|
| 4,426,773 | 1/1984 | Hargis | 29/832 |
| 4,899,174 | 2/1990 | Newman et al. | 346/107 R |
| 4,970,571 | 11/1990 | Yamakawa et al. | 357/71 |
| 4,980,034 | 12/1990 | Volfson et al. | 204/38.4 |
| 4,991,000 | 2/1991 | Bone et al. | 355/75 |
| 5,027,188 | 6/1991 | Owada et al. | 357/68 |

*Primary Examiner*—T. M. Tufariello
*Attorney, Agent, or Firm*—David A. Howley

[57] ABSTRACT

A method of forming a conductive electrode bump on a first side of a dielectric substrate. The electrode bump is located such that it is in electrical contact with one end of an electrically conductive via passing through the substrate. An electrically conductive test pad, located on a second side of the substrate, is in electrical contact with the opposite end of the via. The method includes the steps of (a)forming a layer of conductive material of generally uniform thickness onto the first side of the substrate, the layer being in a routing pattern for routing electrical signals along the first side; and (b)selectively reducing the thickness of the layer in locations defining the routing pattern to a greater extent than in the location of the bump to provide a bump, that extends from the first side at a height greater than the routing pattern.

12 Claims, 2 Drawing Sheets

METHOD OF GENERATING A SUBSTRATE ELECTRODE FOR FLIP CHIP AND OTHER APPLICATIONS

TECHNICAL FIELD OF THE INVENTION

The present invention relates generally to the area of high density substrate and component attachment technology and, more specifically, to a method for the generation of substrate electrode bumps for flip chip mounted devices, such as integrated circuits (ICs), using a subtractive process.

BACKGROUND ART

In recent years, with the advances made in the miniaturization of electronic devices, integration densities of IC (SSI, MSI, LSI AND VLSI) chips have been greatly increased. In mounting of semiconductor devices, such as ICs, onto a substrate, the distance (pitch) between electrode bumps (bumps) has been reduced while the number of input/output(I/O) terminals has been increased. In card type calculators and IC cards, a demand has arisen for developing low-profile products which require short pitches.

Wireless bonding, such as tape automated bonding (TAB) and flip chip, can advantageously realize collective bonding of bumps with high-precision alignment between the bumps, low-profile automatic mounting of semiconductor elements, and high reliability. Therefore, wireless bonding has become a mainstream mounting technique for LSI chips.

In performing wireless bonding, metal projections known as electrode bumps are generally formed on a substrate or on input/output pads of IC chips. The present methods for creating these bumps suffer from several drawbacks. Obtaining a bump aspect (height/width) ratio of greater than 1.5/1 is difficult to achieve. Relative bump positional tolerances are not satisfactory. Flip chip bond verification cannot be easily accomplished and the bump contact resistance is high. A further problem is Temperature Coefficient of Expansion (TCE) mismatch between the substrate and the semiconductor die mounted to the substrate. For example, for many applications the IBM C4 process is nonacceptable for Die greater than approximately 600 mils due to TCE mismatch. This problem is exacerbated in I/O pads located in corners of the substrate because shear forces due to TCE mismatch are in multiple directions.

SUMMARY OF THE INVENTION

In view of the foregoing discussion, an object of this invention is to provide a method of electrode bump formation which overcomes the deficiencies of the prior art.

The present invention encompasses a method of forming a conductive electrode bump on a first side of a dielectric substrate. The electrode bump is located such that it is in electrical contact with one end of an electrically conductive via passing through the substrate. An electrically conductive test pad, located on a second side of the substrate, is in electrical contact with the opposite end of the via. The method includes the steps of (a) forming a layer of conductive material of generally uniform thickness onto the first side of the substrate, the layer being in a routing pattern for routing electrical signals along the first side; and (b) selectively reducing the thickness of the layer in locations defining the routing pattern to a greater extent than in the location of the bump. This results in a bump that extends from the first side at a height greater than the routing pattern.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

Figure 1:
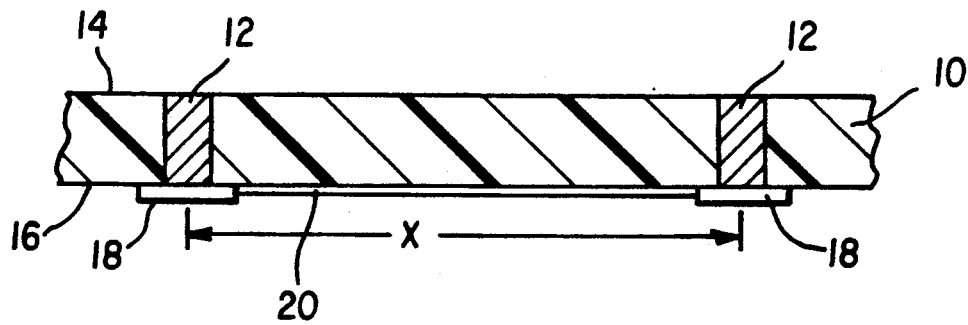
FIG. 1 is a side schematic illustration, in section, of a substrate with vias therethrough.

With reference to FIG. 1, a dielectric substrate 10 has vias 12 therethrough which connect a first side 14 of substrate 10 to a second side 16 of substrate 10. Vias 12 are spaced at a pitch X of preferably about 10 mils. The vias are made of an electrically conductive material which will improve the existing substrate thermal mismatch with flip chipped silicon or gallium/arsenide devices. Examples of such a material for the vias are copper or an aluminum-silicon alloy.

Figure 2:
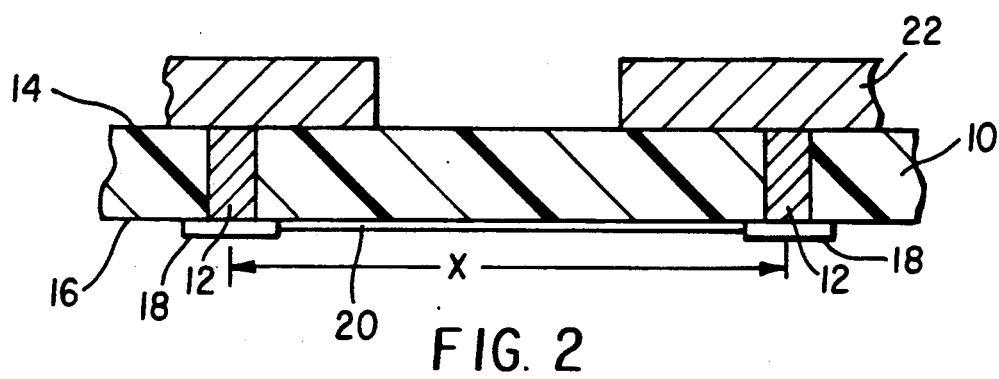
FIG. 2 is a side schematic illustration, in section, after a conductive routing pattern has been applied on the substrate.

Located on second side 16 are electrically conductive test pads 18 which contact vias 12. Test pads 18 are preferably at a fixed pitch and size for all applications. This pitch allows for standardized test tooling (fixed hard tooling in the case of contact testing) independent of any specific application. Initially, test pads 18 are electrically connected together by a thin, fixed, conductive interconnect layer 20 which is preferably made of gold. Referring to FIG. 2, an electrically conductive layer 22 of generally uniform thickness, made of a material such as aluminum or copper, is formed onto a first side 14 of the substrate in a circuit routing pattern. The circuit routing pattern routes electrical signals along first side 14. Formation of layer 22 may be accomplished by using a direct laser write process which will deposit a very thin layer of conductive material on the substrate in the desired circuit routing pattern. This thin layer may be thickened by electroplating, using interconnect layer 20, test pads 18 and vias 12 to connect the thin layer as a cathode in the electroplating process. Preferably, the thin layer is thickened such that layer 22 will have a thickness of about 25 microns or greater. Alternatively, to generate the circuit routing pattern on the substrate, layer 22 can be applied via standard sputtering or lift off processes and standard photolithographic processes.

Figure 3:
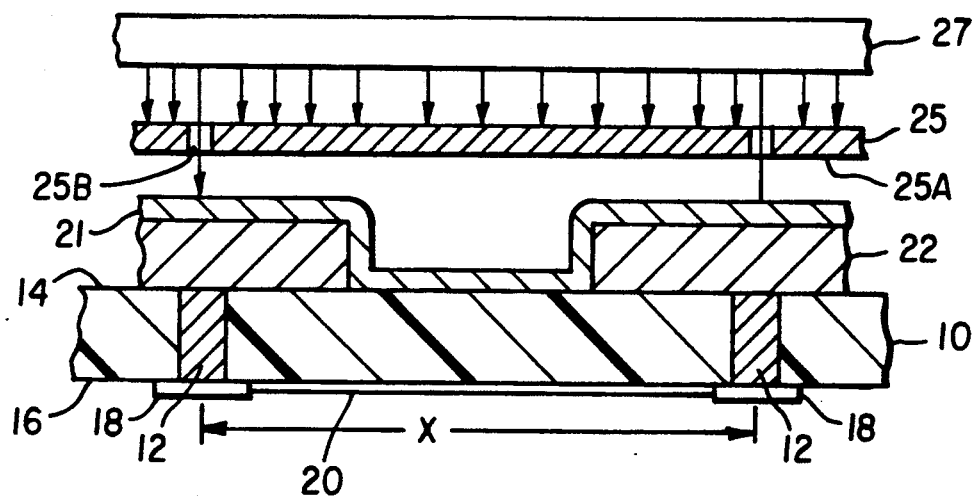
FIG. 3 is a side schematic illustration, in section, after a photoresist has been applied to the routing pattern.

Referring to FIG. 3, a photolithographic method is used to create conductive electrode bumps from conductive layer 22. A photoresist layer 21 is applied on conductive layer 22 by, for example, a spin-on process. A mask 25 is then placed over layer 21. Mask 25 has opaque 25A and transparent 25B sections. The transparent sections are located in a pattern corresponding to the pattern of electrode bumps to be created on substrate 10. A light source 27, emitting actinic (e.g. visible or ultraviolet) radiation, backlights mask 25 with light only passing through transparent sections 25B. This exposure causes a chemical crosslinking of the photoresist so exposed. Because a positive photoresist process was used, layer 21 is treated with an aqueous solution (a solvent would be used for negative photoresist process). This treatment removes all of the photoresist except those portions which were exposed to light.

Conductive layer 22 is now treated with an etchant, such as a weak acid solution, which will selectively reduce the thickness of conductive layer 22. Reduction will not occur in those areas on which the photoresist still remains. This etching step is timed such that those areas of layer 22 so reduced end up with a thickness of about 5 microns. Any photoresist remaining on top of bumps 24 can be removed by contacting the photoresist with a solvent, such as a strong acid or alkali solution, or by a plasma etching technique.

Figure 4:
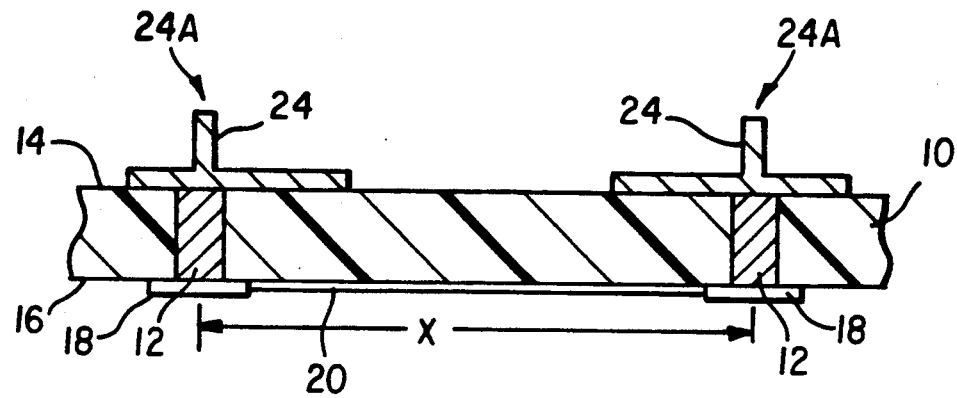
FIG. 4 is a side schematic illustration, in section, after the conductive layer has been reduced in thickness except where bumps are to be located.
Figure 5:
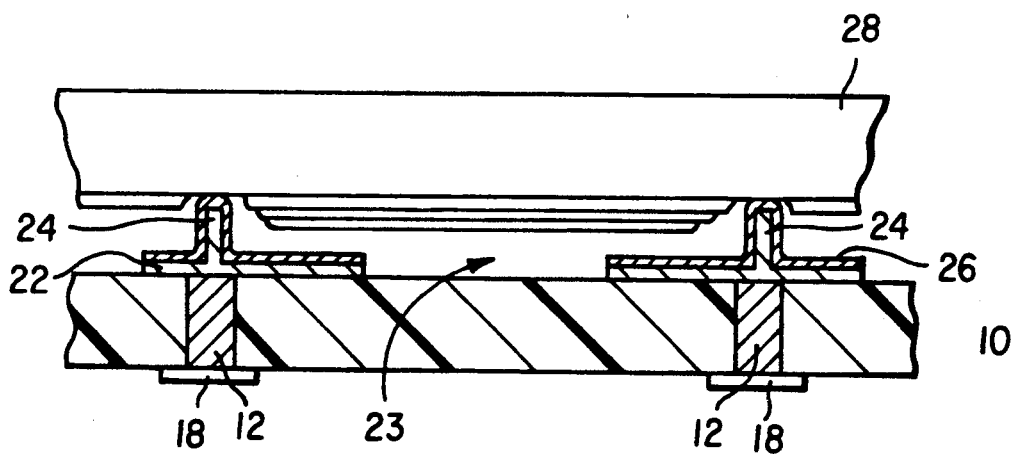
FIG. 5 is a side schematic illustration, in section, after gold has been applied to the bumps.

With reference to FIGS. 4 and 5, the selective reduction of layer 22 creates electrode bumps 24 which have a height of preferably about 20 microns or greater and an aspect ratio of 1.5 × or greater. Each bump is electrically connected to a via through the routing pattern and, preferably, directly overlies its associated via. In a preferred embodiment of the invention, conductive layer 22 is plated with a gold layer 26. Gold layer 26 is provided to minimize interconnect resistance. This plating can be accomplished by an electroplating process utilizing interconnect layer 20 as the cathode. The gold layer may be removed in all areas except at end 24A of electrode 24 to reduce cost if this layer is not needed to reduce interconnect impedance. Conductive interconnect layer 20 is eliminated by removing it with a single polish step or laser trim to electrically isolate test pads 18 from each other.

A semiconductor die 28 is shown flip chip mounted to bumps 24. All semiconductor die may be flip chip mounted to the electrodes using, as is conventional, an ultraviolet or heat activated adhesive (conductive or not). Reference may also be made to our application U.S. Ser. No. 07/838,979 for a method of adhesively attaching semiconductor chips to circuit substrates. At system level module verification, or final test verification, all semiconductor IC pads are accessible through test pads 18. This minimizes built-in self-test constraints.

Since the electrode bumps are formed from the same conductive layer as the circuit routing pattern, the location of the bumps relative to the routing pattern is well defined. This allows alignment targets, formed from the conductive layer, to be used to accurately align semiconductor IC pads with the lumps. The present invention greatly simplifies the flip chip mounting process by eliminating the need for complicated optics which are presently required to accurately align the semiconductor die with the circuit routing pattern on the substrate.

There has therefore been described an improved method for generating electrode bumps using a subtractive process that facilitates the manufacture of bumps with a bump aspect ratio of preferably greater than 1.5/1 and establishes good bump positional tolerances.

The invention has been described in detail with particular reference to preferred embodiments thereof, but it will be understood that variations and modifications can be effected within the spirit and scope of the invention.

What is claimed is:

1. A method of forming a conductive electrode bump on a first side of a dielectric substrate, the bump being located such that it is in electrical contact with one end of an electrically conductive via passing through the substrate, an electrically conductive test pad being in contact with the opposite end of the via and located on a second side of the substrate, said method comprising the steps of:

forming a layer of conductive material of generally uniform thickness onto said first side of said substrate, the layer being in a routing pattern for routing electrical signals along said first side; and selectively reducing the thickness of the layer in locations defining said routing pattern to a greater extent than in the location of the bump to provide a bump that extends from said first side at a height greater than said routing pattern.

2. The method as defined in claim 1 wherein said depositing step is effective to deposit a layer of conductive material that is about 25 microns or greater in thickness and wherein said reducing step is effective to remove all but about 5 microns of said conductive material except where said bump is to be located.

3. The method as defined in claim 2 further comprising the step of:

coating at least the end of said bump opposite said substrate with gold.

4. The method as defined in claim 3 further comprising the step of:

eliminating an electrical connection between said test pad and other test pads on the second side of the substrate.

5. The method as defined in claim 1 further comprising the step of:

coating at least the end of said electrode opposite said substrate with gold.

6. The method as defined in claim 5 further comprising the step of:

eliminating an electrical connection between said test pad and other test pads on the second side of the substrate.

7. The method as defined in claim 1 further comprising the step of:

eliminating an electrical connection between said test pad and other test pads on the second side of the substrate.

8. The method as defined in claim 1 wherein said bump directly overlies said via.

9. A method of forming a conductive electrode bump on a first side of a dielectric substrate, said method comprising the steps of:

forming a layer of conductive material of generally uniform thickness onto said first side of said substrate, the layer being in a routing pattern for routing electrical signals along said first side; and selectively reducing the thickness of the layer in locations defining said routing pattern to a greater extent than in the location of the bump to provide a bump that extends from said first side at a height greater than said routing pattern.

10. The method as defined in claim 9 wherein said depositing step is effective to deposit a layer of conductive material that is about 25 microns or greater in thickness and wherein said reducing step is effective to remove all but about 5 microns of said conductive material except where said bump is to be located.

11. The method as defined in claim 10 further comprising the step of:
coating at least the end of said bump opposite said substrate with gold.

12. The method as defined in claim 9 further comprising the step of:
coating at least the end of said electrode opposite said substrate with gold.

* * * * *